(12) United States Patent
Nguyen Hoang et al.

(10) Patent No.: US 7,985,673 B2
(45) Date of Patent: Jul. 26, 2011

(54) SEMICONDUCTOR DEVICE FOR LOW-POWER APPLICATIONS AND A METHOD OF MANUFACTURING THEREOF

(75) Inventors: Viet Nguyen Hoang, Leuven (BE); Phillip Christie, Leuven (BE); Julien M. M. Michelon, Le Boulay (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/306,035

(22) PCT Filed: Jun. 15, 2007

(86) PCT No.: PCT/IB2007/052288
§ 371 (c)(1),
(2), (4) Date: Oct. 16, 2009

(87) PCT Pub. No.: WO2008/007256
PCT Pub. Date: Jan. 17, 2008

(65) Prior Publication Data
US 2010/0052180 A1 Mar. 4, 2010

(30) Foreign Application Priority Data
Jun. 21, 2006 (EP) .................................... 06115814

(51) Int. Cl.
*H01L 21/4763* (2006.01)
(52) U.S. Cl. .................. 438/618; 438/584; 257/210
(58) Field of Classification Search .................. 438/584, 438/618; 257/210, 211, 773, E23.012; 716/4, 716/5, 21
See application file for complete search history.

(56) References Cited

U.S. PATENT DOCUMENTS

| | | | |
|---|---|---|---|
| 6,153,522 A * | 11/2000 | Takagi et al. | 438/687 |
| 6,181,011 B1 * | 1/2001 | Rostoker et al. | 257/758 |
| 6,255,852 B1 | 7/2001 | Forbes et al. | |
| 6,680,540 B2 * | 1/2004 | Nakano et al. | 257/758 |
| 6,864,584 B2 | 3/2005 | Hanaoka et al. | |
| 6,908,857 B2 * | 6/2005 | Akamatsu et al. | 438/688 |
| 6,946,387 B2 | 9/2005 | Wada et al. | |
| 6,978,434 B1 * | 12/2005 | Shigyo et al. | 716/13 |
| 7,348,674 B2 | 3/2008 | Farrar | |

FOREIGN PATENT DOCUMENTS
EP 0343698 A1 11/1998

OTHER PUBLICATIONS

Stamper, A.K. et al. "Advanced Wiring RC Delay Issues for sub-0.25-micron Generation CMOS," IBM Microelectronics, Essex Junction, Vermont 05452, 1998.

* cited by examiner

*Primary Examiner* — Phuc Dang (57) ABSTRACT

The invention relates to a semiconductor device manufactured in a process technology, the semiconductor device having at least one wire located in an interconnect layer of said semiconductor device, the at least one wire having a wire width (W) and a wire thickness (T), the wire width (W) being equal to a minimum feature size of the interconnect layer as defined by said process technology, wherein the minimum feature size is smaller than or equal to 0.32 μm, wherein the aspect ratio (AR) of the at least one wire is smaller than 1.5, the aspect ratio (AR) being defined as the wire thickness (T) divided by the wire width (W). The invention further discloses a method of manufacturing such a semiconductor device.

15 Claims, 7 Drawing Sheets

SEMICONDUCTOR DEVICE FOR LOW-POWER APPLICATIONS AND A METHOD OF MANUFACTURING THEREOF

This application is a 35 U.S.C. §371 national stage entry of International Application No. PCT/IB07/52288 filed on Jun. 15, 2007.

The invention relates to a semiconductor device manufactured in a process technology, the semiconductor device having at least one wire located in an interconnect layer of said semiconductor device, the at least one wire having a wire width and a wire thickness, the wire width being equal to a minimum feature size of the interconnect layer as defined by said process technology, the minimum feature size being smaller than or equal to 0.32 µm.

The invention further relates to methods of manufacturing same.

The International Technology Roadmap for Semiconductors (ITRS) roadmap 2005 Edition forecasts the trends in semiconductor technology development. One part of this roadmap is devoted to trends in on-chip interconnect. In table 80a and table 80b of the ITRS roadmap various technology parameters are presented and how they are expected to scale. Moore's Law tells us that the packing density of integrated circuits increases with each new process technology. As a consequence of this various parameters have to be scaled, which is clearly shown in the tables. In order to facilitate process scaling according to Moore's Law, all minimum feature sizes of a process technology (gate length, interconnect width, interconnect spacing) have to be reduced. However, some sizes will diminish faster than others. It is generally believed that the interconnect thickness cannot scale as fast as the interconnect width, meaning that the aspect ratio of interconnect increases in each new process technology. The main argument for this is that a reduced cross-sectional area results in an increased wire resistance, which has a negative influence on the delay (RC-constant goes up). A side effect of thicker wires is that the wire capacitance increases.

A drawback of known semiconductor devices according to the ITRS roadmap is their relatively high power dissipation.

It is an object of the invention to provide a semiconductor device of the kind set forth in the opening paragraph, which is more suitable for low-power applications.

The invention is defined by the independent claims. The dependent claims define advantageous embodiments.

The object of the invention is realized in that the aspect ratio of the at least one wire is smaller than 1.5, the aspect ratio being defined as the wire thickness divided by the wire width. A smaller aspect ratio of the wire implies a thinner wire (at a fixed width) and thus a reduced wire capacitance. Especially in nowadays' process technologies the total wire capacitance is heavily dominated by the intra-layer sidewall capacitances (from a wire to its neighboring wire in the same interconnect layer), and when the ITRS roadmap is properly followed this dominance is going to be worse. Measures like the introduction of dielectrics with lower k-values are only short-term solutions to this problem.

The invention relies upon the insight that in certain applications and under certain conditions the wires can be made thinner without threatening the timing of the integrated circuit. Indeed, the interconnect resistance increases when the wires are made thinner. However, low-power application circuits are often not very timing critical and therefore driving stages therein are designed with lower drive strengths. This means that the transistors of those driving stages have smaller channel widths (gate length) and thus the driving stages will have higher output resistances. Completely opposite to what is expected these days, the inventors have observed that for short wires the overall delay even reduces when the wires are made thinner. A lower aspect ratio of the wires also results in a lower capacitance and thus power dissipation is severely reduced in the semiconductor device according to the invention. As has been stated earlier, the wire delay goes down in certain situations (short wires), which means that in those situations the driving stages can be designed to be even weaker and this even further reduces the power dissipation. Basically, it is up to the integrated circuit designer to make a trade-off between delay and power dissipation.

Preferably, in the semiconductor device according to the invention, the process technology is a 0.18 µm technology node or smaller.

An advantageous embodiment of the semiconductor device according to the invention is characterized in that the minimum feature size is smaller than or equal to 0.20 µm. In this embodiment, the impact of the invention is larger. A smaller wire width means a higher aspect ratio, which means that the wire capacitance is more dominant over the total parasitic capacitance (wire capacitance plus gate capacitance). Hence, reducing the aspect ratio of such a wire will have more impact on the capacitance reduction.

Preferably, in the latter embodiment of the semiconductor device according to the invention the process technology is a 0.13 µm technology node or smaller.

In an advantageous embodiment of the semiconductor device the aspect ratio of the wire is smaller than 1.333. In this range delay initially reduces for short wires when the aspect ratio is reduced. Preferably, the aspect ratio of the wire is smaller than 1, because the delay stays low in this range. In a further embodiment of the semiconductor device the aspect ratio of the wire is smaller than 0.667. Indeed, for short wires, the power-delay product goes further down when the aspect ratio is reduced.

The invention also relates to a method of manufacturing a semiconductor device in a process technology, the semiconductor device having an interconnect layer. The method according to the invention comprises the following steps of:

providing a semiconductor body comprising a substrate covered with a patterned dielectric layer having at least one trench with sidewalls, the dielectric layer being covered with a conductive layer, the conductive layer filling the trench;

planarizing to form a wire filling the trench, the wire having a wire width and a wire thickness, the wire width being equal to the minimum feature size of the interconnect layer as defined by said process technology, wherein the minimum feature size is smaller than or equal to 0.32 µm, the wire having an aspect ratio smaller than 1.5, the aspect ratio being defined as the wire thickness divided by the wire width. This method provides a convenient way of forming a semiconductor device according to the invention.

A first embodiment of the method according to the invention is characterized in that in the step of providing a semiconductor body, the conductive layer also covers the dielectric layer outside the trench, wherein the trench defines a wire having an aspect ratio larger than 1.5, the method further being characterized in that, in a first substep of the step of planarizing to form the wire, the planarizing of the conductive layer is done until the dielectric layer outside the trench is reached, and in that, in a second substep of the step of planarizing to form the wire, the semiconductor body is further planarized such that the dielectric layer and the wire inside the trench are thinned down to an aspect ratio smaller than 1.5. This first embodiment of the method according to the invention provides a convenient way of forming a semiconductor device according to the invention.

Preferably, the first embodiment of the method is characterized in that in the step of providing a semiconductor body, the semiconductor body further comprises a barrier layer, wherein the barrier layer has been provided between the dielectric layer and the conductive layer such that the barrier layer also covers the sidewalls of the trench, and further characterized in that the step of planarizing the conductive layer is done until the barrier layer is reached, whereafter the barrier layer outside the trench is removed during the step of further planarizing the semiconductor body. This embodiment allows the integration of interconnect materials which are detrimental to integrated circuits when they start diffusing through the device, such as Copper. The barrier layer effectively encapsulates the conductive material so that it cannot diffuse.

A second embodiment of the method according to the invention is characterized in that in the step of providing a semiconductor body, the conductive layer also covers the dielectric layer outside the trench, wherein the trench defines a wire having an aspect ratio smaller than 1.5, the method further being characterized in that, in the step of planarizing to form the wire, the planarizing of the conductive layer is done until the dielectric layer outside the trench is reached. In this second embodiment the method according to the invention provides an alternative way of forming a semiconductor device according to the invention.

Preferably, the second embodiment of the method is characterized in that in the step of providing a semiconductor body, the semiconductor body further comprises a barrier layer, wherein the barrier layer is provided between the dielectric layer and the conductive layer such that the barrier layer also covers the sidewalls of the trench, and further characterized in that the step of planarizing the conductive layer is done until the barrier layer is reached, whereafter the semiconductor body is further planarized such that the barrier layer outside the trench is removed. This embodiment allows the integration of interconnect materials which are detrimental to integrated circuits when they start diffusing through the device, such as Copper. The barrier layer effectively encapsulates the conductive material so that it cannot diffuse.

How the present invention may be put into effect will now be described by way of example with reference to the appended drawings, in which.

Each layer in a process technology has a minimum feature size (the minimum dimension which can be manufactured resulting in acceptable reliability, integrity and performance of the integrated circuit). The minimum feature sizes of all layers within one process technology are in general not all the same. For example the minimum feature size of a polysilicon gate track is in general smaller than the minimum feature size of an interconnect wire.

A technology node is also being referred to as a technology generation. In literature both terms are used interchangeably.

Figure 1A:
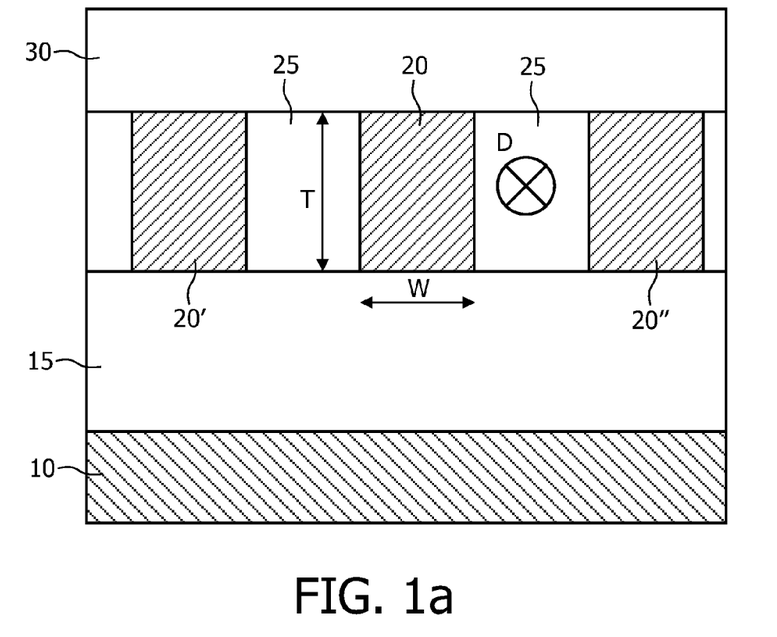
FIG. 1a illustrates a schematic cross-sectional view of an integrated circuit comprising wires.

FIG. 1a illustrates a schematic cross-sectional view of an integrated circuit comprising wires. The integrated circuit comprises a substrate 10. The substrate 10 may comprise transistors, diodes, resistors, interconnection layers (including wires, vias/contacts), etc. For reasons of clarity all these details have been left out of FIG. 1a. What is important is that the integrated circuit at least comprises a wire 20 extending in a direction D parallel to the substrate. The wire 20 connects a first circuit with a second circuit (not shown in Figure).

The wire 20 may have neighboring wires 20',20". The wire has a thickness T in a direction perpendicular to the substrate and a width W perpendicular to both the substrate and the direction D. The wire is preferably embedded in intra-layer dielectrics 25 and inter-layer dielectrics 15, 30. However, further research into low-k dielectrics may eventually lead to airgaps as intra-layer dielectric 25 becoming feasible. Maybe even air as inter-layer "dielectric" 15,30 will become feasible within some years from now. The aspect ratio of the wire 20 is defined as its thickness T divided by its width W.

Figure 1B:
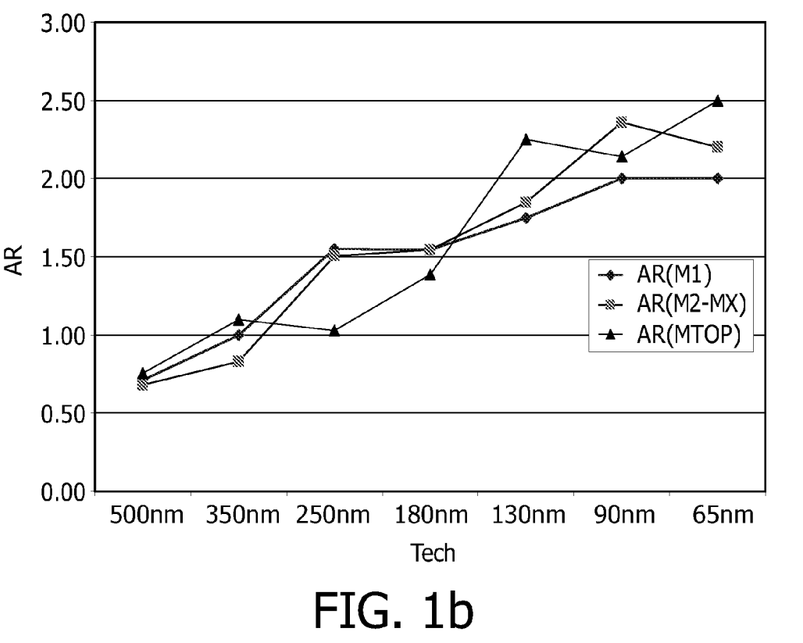
FIG. 1b illustrates a graph, which shows a trend in the development of an aspect ratio of the wires in different layers of the integrated circuit.

As CMOS technologies are scaled towards smaller dimensions (following Moore's Law) there is a clear trend that the aspect ratio of on-chip interconnect goes up. FIG. 1b clearly illustrates this trend for a series of subsequent technology nodes within a company. Moore's Law tells us that the packing density of integrated circuits increases with each new process technology. As a consequence of this various parameters have to be scaled which is clearly shown in the tables of the ITRS roadmap. Also, the minimum feature sizes of each new process technology (gate length, interconnect width, interconnect spacing) have to be reduced. It is generally believed that the interconnect thickness cannot scale as fast as the interconnect width, meaning that the aspect ratio of interconnect increases in each process technology. The main argument for this is that a reduced cross-sectional area results in an increased wire resistance, which has a negative influence on the delay (RC-constant goes up). A side effect of the thicker wires is that the wire capacitance increases.

FIG. 1b shows three curves. The curve with the diamond dots represents the aspect ratio trend for wires in the first interconnect layer (typically meant for short distance routing, which means distances up to several hundred micrometers). The curve with the square dots represents the aspect ratio trend for wires in the intermediate interconnect layers (typically meant for intermediate distance routing, which means distances up to a few millimeters). The curve with the triangular dots represents the aspect ratio trend for wires in the top interconnect layers (typically meant for long distance routing, which means distances larger than several millimeters). It is important to note that for all three categories of wires the trends in aspect ratio are the same, namely to go up to values over 2 for the 65 nm technology node.

The inventors discovered that the general assumption that the aspect ratio of wires has to increase is wrong, at least under certain conditions. In order to confirm this discovery simulations have been done. The simulated circuit comprised a ring-oscillator having 21 inverting stages including 20 inverters and 1 nand gate. The nand gate was gated with an enable signal which was used to switch the ring oscillator on and off. Also, using this nand-gate the static and dynamic power dissipation could be determined. Each inverter stage comprised a p-type (pMOST) and an n-type transistor (nMOST). In each stage, the width of the gate of the pMOST was 8 µm and the width of the gate of the nMOST was 4 µm. The length of the gate was 0.13 µm for both transistors. In fact the simulation was done in a 0.13 µm technology. The output of the ring oscillator was fed back to the input of the ring oscillator through a piece of copper interconnect (wire load) having different lengths. The simulations were done for 3 different cases, and in particular to cases where the wire had lengths of 100 µm, 500 µm, and 1000 µm, respectively. The wires were laid out in metal 1 (the first interconnect layer) in a meander/serpentine structure. In between the meander lines two grounded comb structures were laid out which act as shield wires for the meander. In this way the capacitance of the wire load was maximized to ground. In all three cases the interconnect width was chosen to be the minimum feature size of the wire, being 0.15 µm in this particular technology. Also, all simulations were done using a barrier layer (required in the case of copper interconnect) with a thickness of 10 nm on the sidewalls and 25 nm at the bottom of the wire. In this example, for the top diffusion barrier layer a dielectric layer comprising silicon carbide (SiC) material was chosen, the layer having a thickness of 30 nm.

Figure 2:
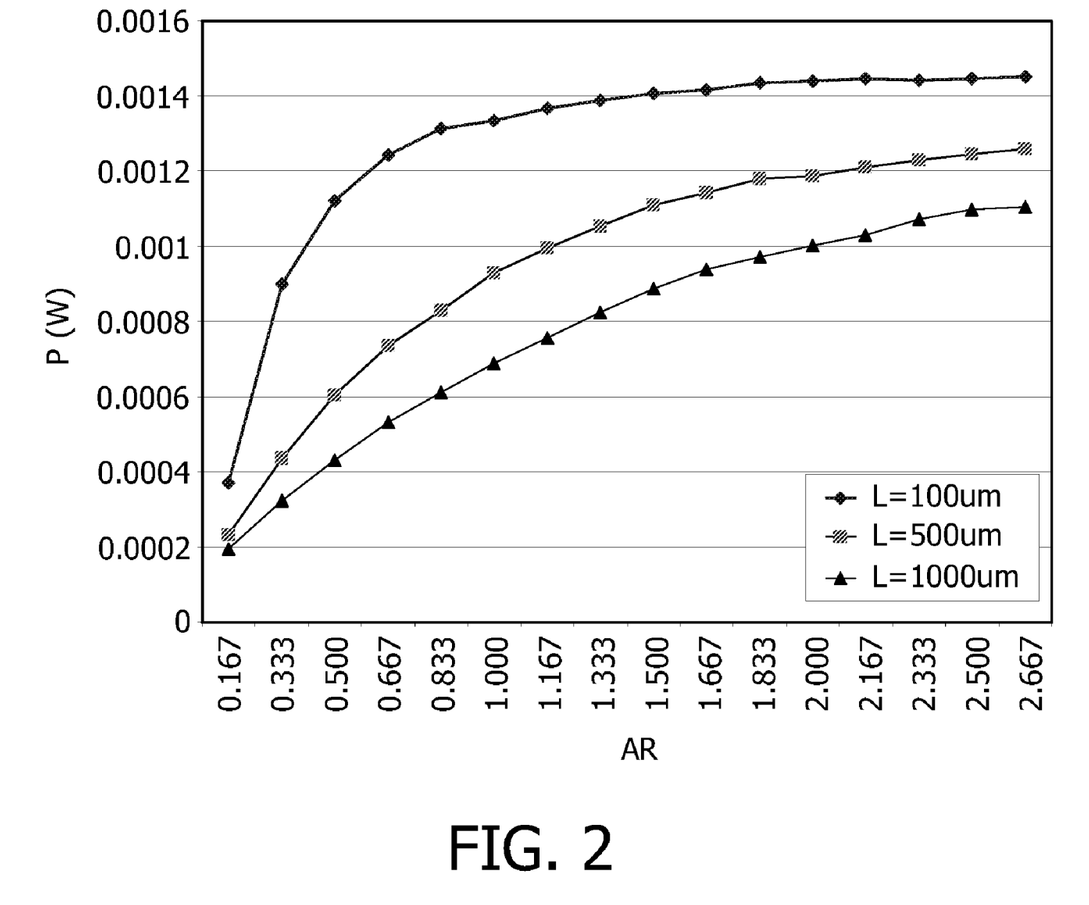
FIG. 2 shows the simulated power dissipation of a specific electric circuit as a function of the aspect ratio of the wires for different wire lengths.
Figure 3:
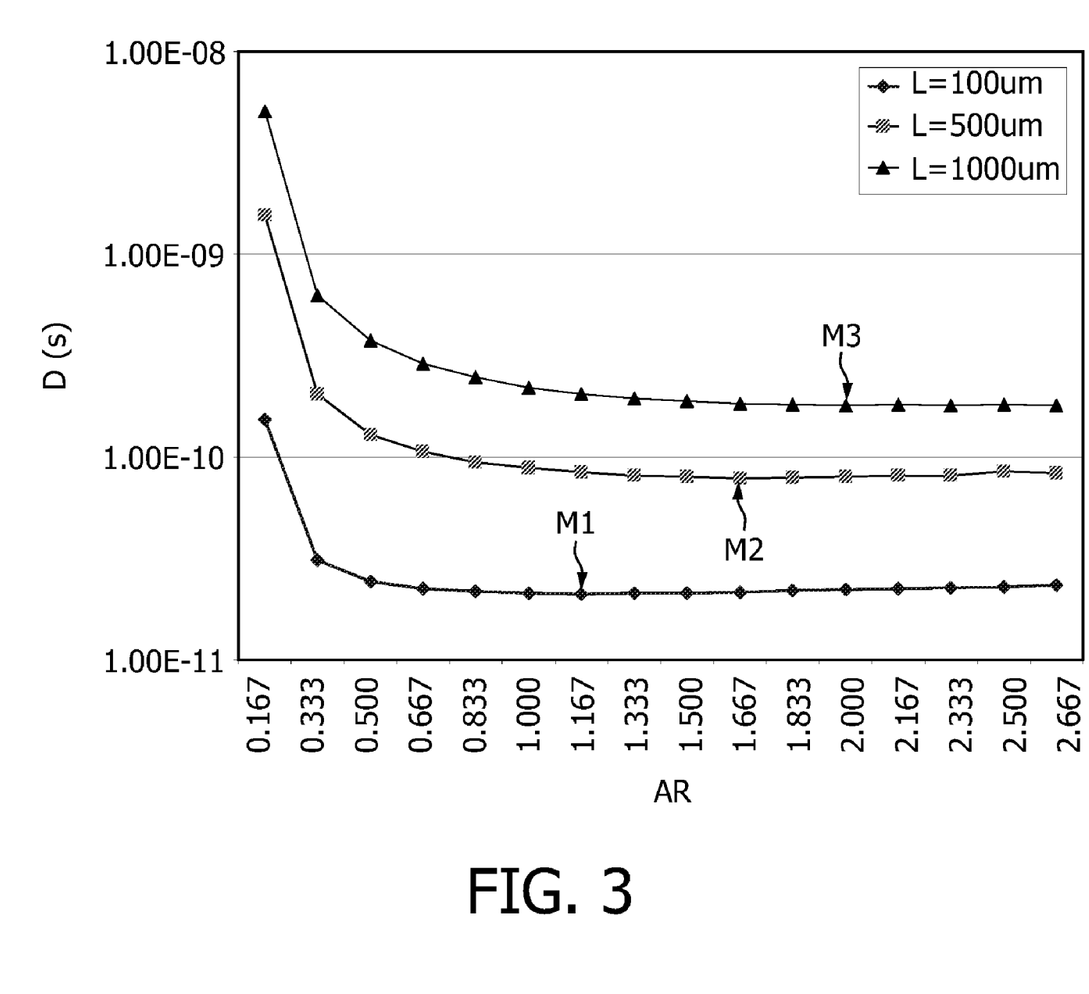
FIG. 3 shows the simulated delay of the electric circuit as a function of the aspect ratio of the wires for different wire lengths.
Figure 4:
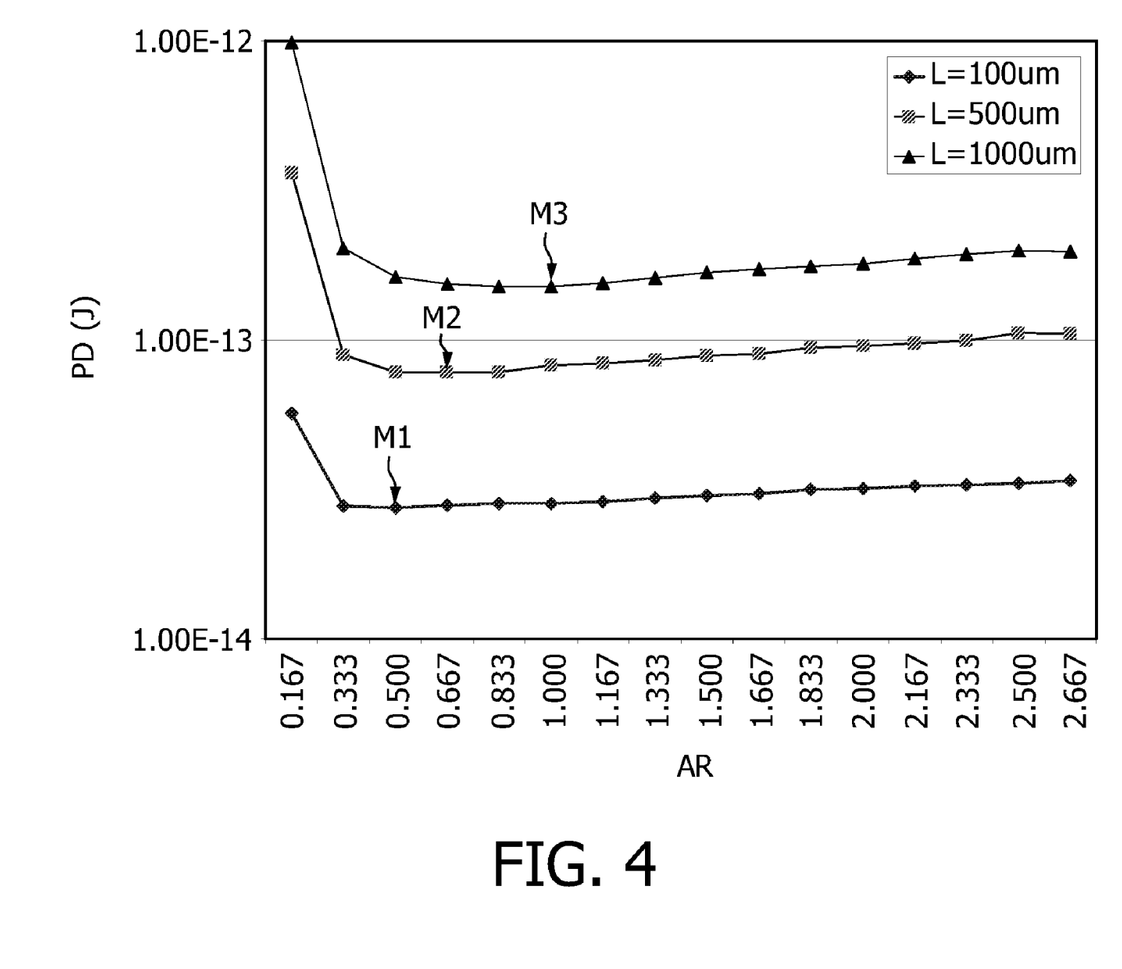
FIG. 4 shows the simulated power-delay product of the electric circuit as a function of the aspect ratio of the wires for different wire lengths.
Figure 5:
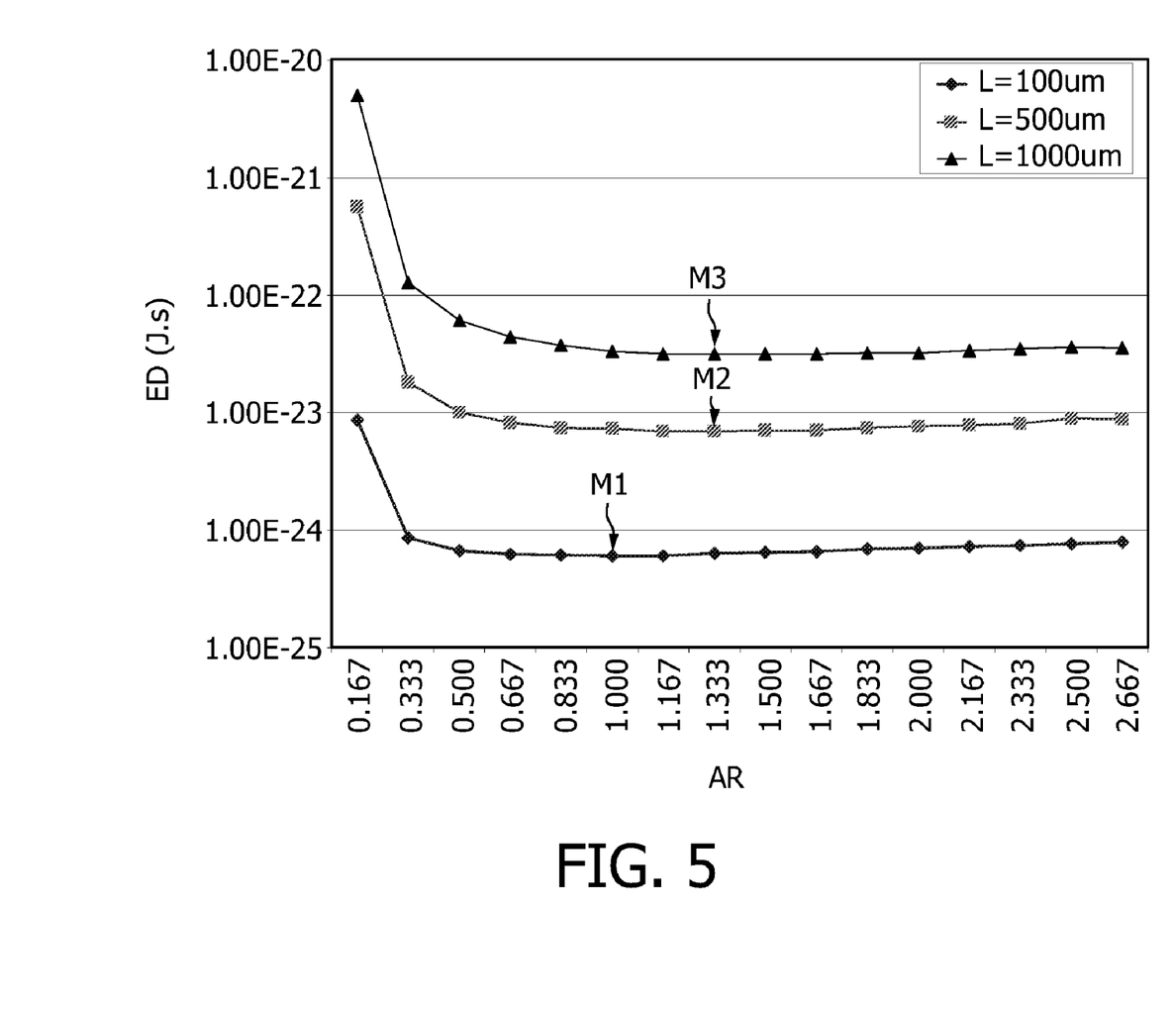
FIG. 5 shows the simulated energy-delay product of the electric circuit as a function of the aspect ratio of the wires for different wire lengths.

The results of the simulations are shown in FIGS. 2 to 5. FIG. 2 shows the simulated power dissipation P of a specific electric circuit as a function of the aspect ratio AR of the wires for different wire lengths. FIG. 3 shows the simulated delay D of the electric circuit as a function of the aspect ratio AR of the wires for different wire lengths. FIG. 4 shows the simulated power-delay product PD of the electric circuit as a function of the aspect ratio AR of the wires for different wire lengths. And FIG. 5 shows the simulated energy-delay product ED of the electric circuit as a function of the aspect ratio AR of the wires for different wire lengths.

Referring to FIG. 2, for all simulated lengths the power dissipation reduces when the aspect ratio AR is reduced. The power dissipation is proportional to the total capacitive load, which includes both the parasitic capacitances in the inverters and the wire load capacitance. When the aspect ratio AR of the wire is reduced (keeping the width the same) the wire sidewall capacitances are reduced, which will reduce the total capacitive load and thus also the power dissipation. It can be noted from FIG. 2 that the simulated power dissipation for the 1000 µm, 500 µm, and 100 µm wire length approaches the same value for very small aspect ratios AR. This can be explained as follows: the smaller the aspect ratio AR, the thinner the wire the less wire capacitance. The limit of this trend is that there is no wire at all (aspect ratio=0) and thus no wire capacitance. All that is left then is the parasitic capacitance in the gate, which is the same for all wire lengths in the simulations.

Referring to FIG. 3, several important observations can be done. First of all, the delay (measured from input to input on the ring oscillators) shows minima M1, M2, M3 for all simulated lengths. For the ring oscillator having a 1000 µm wire on the output, the minimum delay is shown at an aspect ratio AR of 2. For the ring oscillator having a 500 µm wire on the output, the minimum delay is shown at an aspect ratio AR of 1.667. For the ring oscillator having a 100 µm wire on the output, the minimum delay is shown at an aspect ratio AR of 1.167. It is quite striking that for the short wire ring oscillator (L=100 µm) the delay first reduces when the aspect ratio AR is reduced when starting with an aspect ratio of 2.667. What is even more important is that the delay curve for the 100 µm wire ring oscillator is very flat in the aspect ratio AR range from 2.667 down to 0.500! In other words, the power dissipation can be reduced without (almost) any delay penalty by implementing the short wires (e.g. L<=100 µm) with a much lower aspect ratio. This is very interesting for low-power applications where timing is less critical. Another important observation from FIG. 2 is that for wires having a length below 1000 µm an increased aspect ratio (starting from an aspect ratio AR of 2 which is common these days) does not really help to reduce the delay. Increasing the drive strength of the inverters may reduce the delay, but that will definitely increase the power dissipation in return.

Referring to FIG. 4, an important metric is the power-delay product. The simulations have shown that the power-delay product also shows minima M1, M2, M3 for all simulated lengths. For the ring oscillator having a 1000 µm wire on the output, the minimum power-delay product is shown on an aspect ratio AR of 1. For the ring oscillator having a 500 µm wire on the output, the minimum powerdelay product is shown at an aspect ratio AR of 0.667. For the ring oscillator having a 100 µm wire on the output, the minimum power-delay product is shown at an aspect ratio AR of 0.500. It can be noted that these minima are located at smaller aspect ratios AR than for the delay curves (FIG. 3).

It is possible to sacrifice some timing (increase the delay) in order to further reduce the power dissipation, e.g. by downsizing the drive strengths of the inverters. It is also possible to sacrifice some power dissipation to further reduce the delay. Hence, the power-delay product is an interesting metric, which captures both situations. The inverse of the power-delay product can be regarded as an efficiency factor. In other words: the lower the power-delay product, the better.

The most important observation from FIG. 4 is that the power-delay product for ring oscillators having wires of 100 µm reaches its minimum at an aspect ratio AR of 0.5. In low-power applications such an aspect ratio seems therefore a very good choice for the short wires.

Referring to FIG. 5, yet another important metric is the energy-delay product, which is defined as power times delay times delay.

The simulations have shown that the energy-delay product also shows minima M1, M2, M3 for all simulated lengths. For the ring oscillator having a 1000 µm wire on the output, the minimum energy-delay product is shown at an aspect ratio AR of 1.333. For the ring oscillator having a 500 µm wire on the output, the minimum energy-delay product is shown at an aspect ratio AR of 1.333. For the ring oscillator having a 100 µm wire on the output, the minimum energy-delay product is shown at an aspect ratio AR of 1. These minima are still significantly lower than that which is presented in the ITRS roadmap.

From FIGS. 2 to 5 can be extracted that the aspect ratio is preferably below 1.5. The lower limit is merely set by the wire length. For example, at a wire length of 100 µm the lower limit might be 0.333, but for shorter wire lengths a lower aspect ratio might be better. In a preferred embodiment of the invention the aspect ratio is smaller than 1.333. This range is attractive in terms of delay. In case the power-delay product is further optimized the aspect ratio AR is preferably smaller than 1 and for very short wires (L<=100 µm) preferably smaller than 0.667. The smaller the aspect ratio AR, the lower the power dissipation.

Figure 6A:
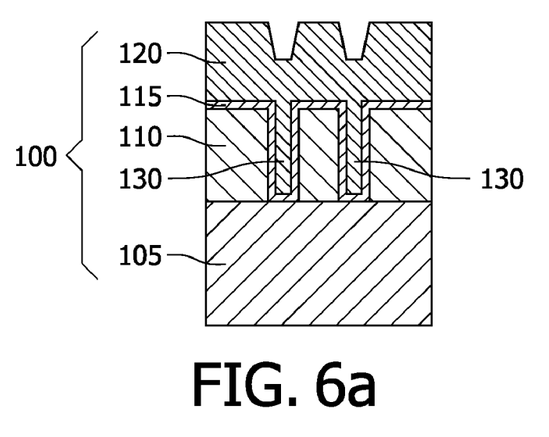
FIGS. 6a-6c show different stages of a first method of manufacturing an integrated circuit according to the invention.
Figure 6B:
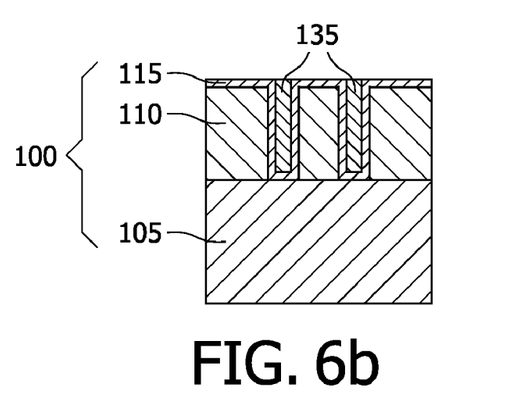
Figure 6C:
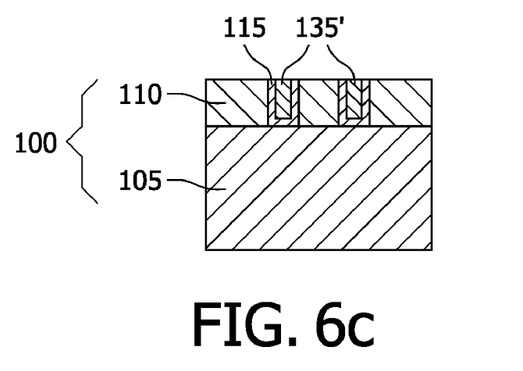

Various methods of manufacturing the semiconductor device according to the invention exist. FIGS. 6a-6c show different stages of a first method of manufacturing an integrated circuit according to the invention. In the stage illustrated in FIG. 6a a semiconductor body 100 is provided. The semiconductor body 100 comprises a substrate 105 being covered with a patterned dielectric layer 110 having at least one trench 130 with sidewalls. The dielectric layer 110 is covered with a conductive layer 120. The conductive layer 120 fills the trench 130 and covers the dielectric layer 110 outside the trench 130. The trench 130 defines a wire having an aspect ratio larger than 1.5. In a further embodiment of the first method the semiconductor body 100 comprises a barrier layer 115, wherein the barrier layer 115 has been provided between the dielectric layer 110 and the conductive layer 120 such that the barrier layer 115 also covers the sidewalls of the trench 130. This embodiment is advantageous in case copper is used for the conductive material. Copper tends to diffuse through silicon oxide and once diffused into the substrate it severely degrades the performance of the integrated circuit. The barrier layer 115 is then needed to form a diffusion-blocking layer. The usage of barrier layers is well-known to the person skilled in the art.

In the stage illustrated in FIG. 6b the conductive layer 120 is planarized until the dielectric layer 110 outside the trench 130 is reached. In this way a wire 135 is formed filling the trench 130. The wire 135 has a wire width and a wire thickness, wherein the wire width is equal to the minimum feature size of the interconnect layer as defined by the process technology used. In the semiconductor device according to the invention the minimum feature size of this interconnect layer is smaller than or equal to 0.32 μm, which complies with a 0.18 μm technology node or beyond in most companies. In the embodiment in which a barrier layer 115 is used the step of planarizing the conductive layer 120 is done until the barrier layer 115 is reached.

In the stage illustrated in FIG. 6c the semiconductor body 100 is planarized such that the dielectric layer 110 and the wire 135 inside the trench 130 are thinned down to an aspect ratio smaller than 1.5. The aspect ratio is defined as the wire thickness divided by the wire width. In the embodiment where a barrier layer 115 is used, this step comprises two sub-steps. In a first sub-step the barrier layer 115 outside the trench 130 is removed, whereas in a second sub-step the dielectric layer 110 and the wire 135 are thinned down further. In one embodiment of the method the step in FIG. 6c may be done by simply extending the polishing time of the barrier removal step. However, in that case it is important that the barrier removal step must have an identical removal rate for barrier material, copper and the dielectric material. In FIG. 6c the high-aspect ratio wire 135 is effectively changed into a low-aspect ratio wire 135'.

Figure 7A:
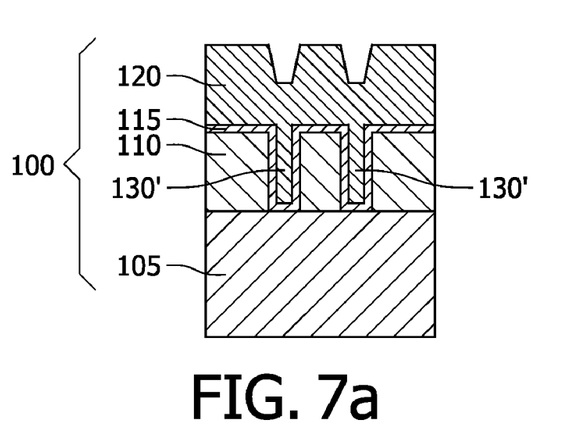
FIGS. 7a-7c show different stages of a second method of manufacturing an integrated circuit according to the invention.
Figure 7B:
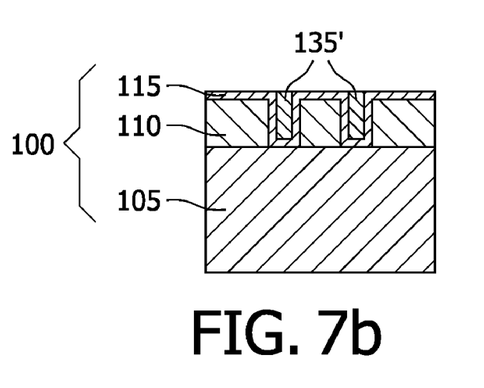
Figure 7C:
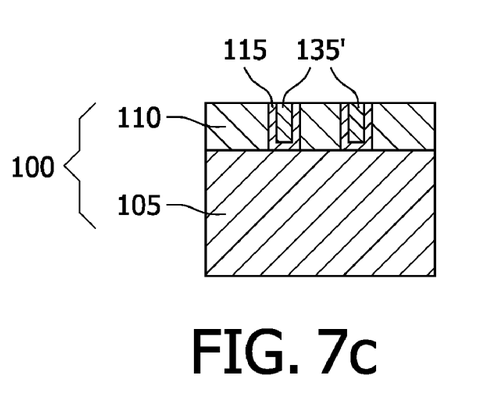

FIGS. 7a-7c show different stages of a second method of manufacturing an integrated circuit according to the invention. The second method has some similarities with the first method. In the stage illustrated in FIG. 7a a semiconductor body 100 is provided. The semiconductor body 100 comprises a substrate 105 which is covered with a patterned dielectric layer 110 having at least one trench 130' with sidewalls. The dielectric layer 110 is covered with a conductive layer 120. The conductive layer 120 fills the trench 130' and covers the dielectric layer 110 outside the trench 130. The difference with the first method is that the trench 130' now defines a wire having an aspect ratio smaller than 1.5, being close to the target aspect ratio of the wire. In other words the dielectric layer 110 has been provided as a thin layer compared to the first method where the dielectric layer 110 has been provided as a conventional thicker layer. In a further embodiment of the second method the semiconductor body 100 comprises a barrier layer 115, wherein the barrier layer 115 is provided between the dielectric layer 110 and the conductive layer 120 such that the barrier layer 115 also covers the sidewalls of the trench 130'.

In the stage illustrated in FIG. 7b the conductive layer 120 is planarized until the dielectric layer 110 outside the trench 130' is reached. In this way a wire 135' is formed filling the trench 130. The wire 135' has a wire width and a wire thickness, wherein the wire width is equal to the minimum feature size of the interconnect layer as defined by the process technology used. In the embodiment in which a barrier layer 115 is used the step of planarizing the conductive layer 120 is done until the barrier layer 115 is reached. In case copper is used as the metallization layer, the planarization step can be done by using a special copper-CMP step. This step must then have an extremely high selectivity between Cu and barrier material.

FIG. 7c is only relevant in case a barrier layer 115 has been used in the second method. In the stage illustrated in FIG. 7c the semiconductor body 100 is further planarized such that the barrier layer 115 outside the trench is removed. This removal can be done both selectively and non-selectively. In case a non-selective CMP step is used, the CMP time has to be precisely controlled. In an alternative embodiment of the second method the barrier layer is not removed in case a non-conductive material is chosen.

In both the first method and the second method the word "planarizing/planarized" has been used. In this specification planarizing is meant to include both CMP techniques, etching techniques (both dry and wet etching), and other removal techniques which will enter the scene in the coming years. All these techniques are considered to be known to the person skilled in the art. Etching chemistries, etching times, various dry etching parameters, CMP slurries, CMP times heavily depend on the manufacturing environment. A person skilled in the art will be capable of finding the right conditions to perform the steps according to the invention without undue burden.

The same holds for material choices. These choices also heavily depend on the manufacturing environment. These days various types of substrate 105 exist, such as bulk substrates, SOI-substrates, strained-layer substrates, etc. The dielectric layer 110 may also comprise various different materials, such as silicon oxide, TEOS, BSPG, PSG, BD1™, BDII™, Aurora™, etc. As far as the conductive layer 120 is concerned, in the past on-chip interconnect was mainly made of aluminum. Several years ago an important part of the total semiconductor industry switched to copper interconnect. It is not unlikely that another switch will be made in the near future in case integrated copper faces its limits. Whether these materials will need barrier layers to prevent diffusion is not known at the moment. The barrier layer 115 may comprise materials such as silicon nitride (SiN), silicon carbide (SiC), tantalum (Ta), tantalum nitride (TaN), titanium nitride (TiN), tungsten carbon nitride (WCN), cobalt tungsten boron (CoWB), and cobalt tungsten phosphor (CoWP), etc. Whatever materials are mentioned in this specification, the skilled person might be able to find alternative materials having similar properties. All these variations are considered to fall under the scope of the invention, as they do not depart from the general inventive thought described in here.

In this specification is disclosed that the integrated circuit according to the invention comprises at least one wire having an aspect ratio below 1.5, and preferably below 1.333, and even more preferably below 1 or 0.5. The invention, prescribing lower aspect ratios than prescribed by the ITRS roadmap, has been proven to be especially effective for short wires, e.g. with a length in the order of 100 μm. Longer wires, however, may need different aspect ratios. A plausible integration scheme could be that one of the interconnect layers is of the low-aspect ratio type, while the others are of a higher-aspect ratio type. Alternatively, more than two different aspect ratios can be integrated in case more than two different metallization layers are used.

The invention thus provides an attractive integrated circuit, which is more suitable for low-power applications. Indeed, the lower aspect ratio than prescribed by the ITRS roadmap provides a much lower power dissipation. Under certain conditions the delay even improves, while everybody would expect the delay to go up, because of the increased wire resistance. Yet, under other conditions the delay might go up a little bit, but just marginally and for low-power applications that might not be a problem at all. Simulations have shown that the minima of the power-delay product are located at aspect ratios significantly lower than the aspect ratios prescribed by the ITRS-roadmap (AR>2). And this means that for thin wires there is an opportunity to further decrease the delay, with the same power dissipation as for thick wires, or to further decrease the power dissipation with the same delay as for thick wires.

The invention also provides methods of manufacturing such an integrated circuit, which are fully compatible with today's process technologies.

Any of the additional features can be combined together and combined with any of the aspects. Other advantages will be apparent to those skilled in the art. Numerous variations and modifications can be made without departing from the claims of the present invention. Therefore, it should be clearly understood that the present description is illustrative only and is not intended to limit the scope of the present invention.

The present invention has been described with respect to particular embodiments and with reference to certain drawings, but the invention is not limited thereto, only by the claims. Any reference signs in the claims shall not be construed as limiting the scope. The drawings described are only schematic and are non-limiting. In the drawings, the size of some of the elements may be exaggerated and not drawn to scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The invention claimed is:

1. A semiconductor device manufactured in a process technology, the semiconductor device having at least one wire located in an interconnect layer of said semiconductor device, the at least one wire having a wire width (W) and a wire thickness (T), the wire width (W) being equal to a minimum feature size of the interconnect layer as defined by said process technology, the minimum feature size being smaller than or equal to 0.32 µm, characterized in that the aspect ratio (AR) of the at least one wire is smaller than 1.5, the aspect ratio being (AR) defined as the wire thickness (T) divided by the wire width (W).

2. A semiconductor device as claimed in claim 1, characterized in that the process technology is a 0.18 µm technology node or smaller.

3. A semiconductor device as claimed in claim 1, characterized in that the minimum feature size is smaller than or equal to 0.20 µm.

4. A semiconductor device as claimed in claim 1, characterized in that the process technology is a 0.13 µm technology node or smaller.

5. A semiconductor device as claimed in claim 1, characterized in that the aspect ratio (AR) of the wire is smaller than 1.333.

6. A semiconductor device as claimed in claim 5, characterized in that the aspect ratio (AR) of the wire is smaller than 1.

7. A semiconductor device as claimed in claim 6, characterized in that the aspect ratio (AR) of the wire is smaller than 0.667.

8. A method of manufacturing a semiconductor device in a process technology, the semiconductor device having an interconnect layer, the method comprising the following steps of:
providing a semiconductor body comprising a substrate covered with a patterned dielectric layer (having at least one trench with sidewalls, the dielectric layer being covered with a conductive layer, the conductive layer filling the trench;
planarizing to form a wire filling the trench, the wire having a wire width (W) and a wire thickness (T), the wire width (W) being equal to the minimum feature size of the interconnect layer as defined by said process technology, wherein the minimum feature size is smaller than or equal to 0.32 µm, the wire having an aspect ratio (AR) smaller than 1.5, the aspect ratio (AR) being defined as the wire thickness (T) divided by the wire width (W).

9. A method as claimed in claim 8, characterized in that in the step of providing a semiconductor body, the conductive layer also covers the dielectric layer outside the trench, wherein the trench defines a wire having an aspect ratio (AR) larger than 1.5, the method further being characterized in that, in a first substep of the step of planarizing to form the wire, the planarizing of the conductive layer is done until the dielectric layer outside the trench is reached, and in that, in a second substep of the step of planarizing to form the wire, the semiconductor body is further planarized such that the dielectric layer and the wire inside the trench are thinned down to an aspect ratio (AR) smaller than 1.5.

10. A method as claimed in claim 9, characterized in that in the step of providing a semiconductor body, the semiconductor body further comprises a barrier layer, wherein the barrier layer has been provided between the dielectric layer and the conductive layer such that the barrier layer also covers the sidewalls of the trench, and further characterized in that the step of planarizing the conductive layer is done until the barrier layer is reached, whereafter during the step of further planarizing the semiconductor body the barrier layer outside the trench is removed.

11. A method as claimed in claim 8, characterized in that in the step of providing a semiconductor body, the conductive layer also covers the dielectric layer outside the trench, wherein the trench defines a wire having an aspect ratio (AR) smaller than 1.5, the method further being characterized in that, in the step of planarizing to form the wire, the planarizing of the conductive layer is done until the dielectric layer outside the trench is reached.

12. A method as claimed in claim 11, characterized in that in the step of providing a semiconductor body, the semiconductor body further comprises a barrier layer, wherein the barrier layer has been provided between the dielectric layer and the conductive layer such that the barrier layer also covers the sidewalls of the trench, and further characterized in that the step of planarizing the conductive layer is done until the barrier layer is reached, whereafter the semiconductor body is further planarized such that the barrier layer outside the trench is removed.

13. A semiconductor device manufactured in a process technology, the semiconductor device having one or more planarized wires located in trenches of a dielectric material in an interconnect layer of said semiconductor device, the at least one wire having a wire width (W) and a wire thickness (T), the wire width (W) being equal to a minimum feature size of the interconnect layer as defined by said process technology, the minimum feature size being smaller than or equal to 0.32 μm, characterized in that the aspect ratio (AR) of the at least one wire is smaller than 1.5, the aspect ratio being (AR) defined as the wire thickness (T) divided by the wire width (W).

14. The semiconductor device as in claim 13, further comprising a barrier layer located between the one or more planarized wires and the dielectric material in the interconnect layer.

15. The semiconductor device as in claim 14, wherein the barrier layer is a material sufficient to prevent diffusion of the one or more planarized wires into the dielectric.

* * * * *